United States Patent
Liu et al.

(10) Patent No.: US 8,536,671 B2
(45) Date of Patent: Sep. 17, 2013

(54) CHIP PACKAGE

(76) Inventors: Tsang-Yu Liu, Zhubei (TW); Yu-Lin Yen, Zhongli (TW); Chuan-Jin Shiu, Zhongli (TW); Po-Shen Lin, New Taipei (TW)

( * ) Notice: Subject to any disclaimer, the term of this patent is extended or adjusted under 35 U.S.C. 154(b) by 0 days.

(21) Appl. No.: 13/154,337

(22) Filed: Jun. 6, 2011

(65) Prior Publication Data

US 2011/0298000 A1 Dec. 8, 2011

Related U.S. Application Data

(60) Provisional application No. 61/352,334, filed on Jun. 7, 2010.

(51) Int. Cl.
*H01L 31/0203* (2006.01)

(52) U.S. Cl.
USPC ............. 257/433; 257/E33.059; 257/E31.122

(58) Field of Classification Search
USPC .................... 257/432, 433, E31.122, E2.002, 257/E31.117, 99, 81, 79, 780, 781, 294, 435, 257/431, E31.127, E33.059
See application file for complete search history.

(56) References Cited

U.S. PATENT DOCUMENTS

| | | | |
|---|---|---|---|
| 6,630,736 B1 * | 10/2003 | Ignaut ............................ | 257/737 |
| 6,831,234 B1 * | 12/2004 | Asai et al. ...................... | 174/261 |
| 7,528,420 B2 * | 5/2009 | Weng et al. ..................... | 257/98 |
| 8,228,426 B2 * | 7/2012 | Matsuo et al. ................. | 348/374 |
| 2005/0056903 A1 * | 3/2005 | Yamamoto et al. ........... | 257/433 |
| 2009/0256260 A1 * | 10/2009 | Nakamura ..................... | 257/758 |
| 2009/0294779 A1 * | 12/2009 | Ida et al. .......................... | 257/82 |
| 2010/0090304 A1 * | 4/2010 | Liu et al. ......................... | 257/432 |
| 2010/0117176 A1 * | 5/2010 | Uekawa .......................... | 257/432 |
| 2010/0207226 A1 * | 8/2010 | Park et al. ....................... | 257/432 |
| 2011/0291139 A1 | 12/2011 | Chiu et al. | |

* cited by examiner

*Primary Examiner* — Matthew Landau
*Assistant Examiner* — Latanya N Crawford
(74) *Attorney, Agent, or Firm* — Liu & Liu

(57) ABSTRACT

According to an embodiment of the invention, a chip package is provided, which includes: a substrate having a first surface and a second surface; an optical device between the first surface and the second surface of the substrate; a protection layer formed on the second surface of the substrate, wherein the protection layer has at least an opening; at least a conducting bump formed in the opening of the protection layer and electrically connected to the optical device; and a light shielding layer formed on the protection layer, wherein the light shielding layer is further extended onto a sidewall of the opening of the protection layer.

28 Claims, 9 Drawing Sheets

CHIP PACKAGE

CROSS REFERENCE TO RELATED APPLICATIONS

This Application claims the benefit of U.S. Provisional Application No. 61/352,334, filed on Jun. 7, 2010, the entirety of which is incorporated by reference herein.

BACKGROUND OF THE INVENTION

1. Field of the Invention

The present invention relates to a chip package, and in particular relates to a light sensing chip package or a light emitting chip package.

2. Description of the Related Art

Optical-electronic devices such as light sensing devices or light emitting devices play important roles in applications of, for example, digital cameras, digital video recorders, mobile phones, solar cells, monitors, or lighting equipments.

Along with advancements in technological development, requirements for light sensing precision of light sensing devices or light emitting precision of light emitting devices have accordingly been increased.

BRIEF SUMMARY OF THE INVENTION

An embodiment of the invention provides a chip package which includes: a substrate having a first surface and a second surface; an optical device between the first surface and the second surface of the substrate; a protection layer formed on the second surface of the substrate, wherein the protection layer has at least an opening; at least a conducting bump formed in the opening of the protection layer and electrically connected to the optical device; and a light shielding layer formed on the protection layer and extending onto a sidewall of the opening of the protection layer.

An embodiment of the invention provides a chip package which includes: a substrate having a first surface and a second surface; an optical device between the first surface and the second surface of the substrate; a protection layer formed on the second surface of the substrate, wherein the protection layer has at least an opening; at least a conducting bump formed in the opening of the protection layer and electrically connected to the optical device; a light shielding layer formed on the second surface of the substrate; and at least a second light shielding layer formed on the second surface of the substrate.

An embodiment of the invention provides a chip package which includes: a substrate having a first surface and a second surface; a protection layer formed on the second surface of the substrate, wherein the protection layer has at least an opening; at least a conducting bump formed in the opening of the protection layer; and an insulating smooth layer formed between the conducting bump and a sidewall of the opening.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as followed. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a light sensing device or a light emitting device. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits.

Figure 1A:
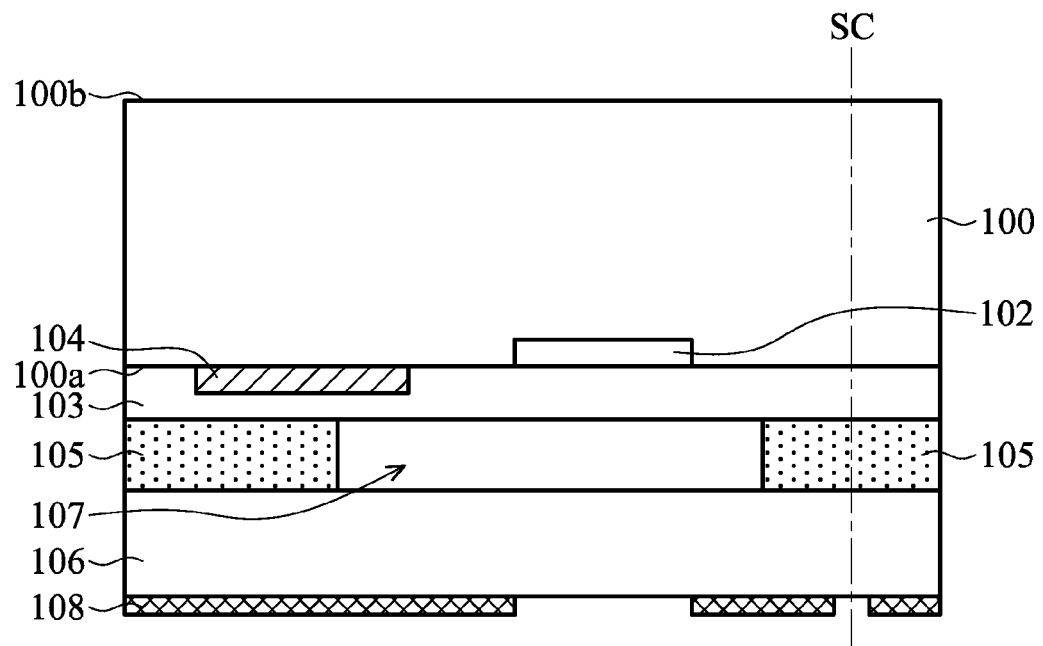
FIGS. 1A-1D are cross-sectional views showing the steps of forming a chip package in accordance with an embodiment of the present invention.

FIGS. 1A-1E are cross-sectional views showing the steps of forming a chip package according to an embodiment of the present invention. As shown in FIG. 1A, a substrate 100 is provided, which has a first surface 100a and a second surface 100b. The substrate 100 may be, for example, a semiconductor substrate or a ceramic substrate. In one embodiment, the substrate 100 is a semiconductor wafer (such as a silicon wafer) and a wafer-level packaging process may be performed to reduce fabrication cost and fabrication time. In the following description, a wafer-level packaging process is taken as an example.

As shown in FIG. 1A, in one embodiment, at least an optical device 102 is between the surface 100a and the surface 100b of the substrate 100. The optical device 102 may include, but is not limited to, a light sensing device or a light emitting device. The light sensing device is, for example, a CMOS image sensor device and the light emitting device is, for example, a light emitting diode device.

In one embodiment, a conducting pad 104 is formed on the surface 100a of the substrate 100. The conducting pad 104 may be electrically connected to, for example, the optical device 102 or another device in the package. In the embodiment shown in FIG. 1A, the conducting pad 104 is formed in the passivation layer 103 on the surface 100a. The passivation layer 103 may be, for example, a dielectric layer such as an oxide layer, nitride layer, oxynitride layer, or combinations thereof. In addition, although only a single layered conducting pad 104 is shown in FIG. 1A, a plurality of conducting pads may be stacked with each other and/or be arranged on the substrate 100. For example, in one embodiment, the conducting pad 104 may include a plurality of conducting pads stacked with each other, at least a conducting pad, or a conducting pad structure composed of at least a conducting pad and at least an interconnection structure.

As shown in FIG. 1A, in one embodiment, a transparent substrate 106 may be optionally disposed overlying the surface 100a of the substrate 100 and the optical device 102. The substrate 100 may be separated from the transparent substrate 106 by, for example, a spacer layer 105 which is disposed to be surrounding the optical device 102. For example, the spacer layer 105 may be fixed to the substrate 100 and/or the transparent substrate 106 through an adhesion layer (not shown). The spacer layer 105, the transparent substrate 106, and the substrate 100 may together surround a cavity 107. Thus, in one embodiment, the optical device 102 is separated from the transparent substrate 106 by the cavity 107 and does not directly contact with the transparent substrate 106.

The transparent substrate 106 may serve as a protecting layer for the optical device 102, which also allows light from external environment to be transmitted to the optical device 102 or allows light emitted by the optical device 102 to be transmitted to the external environment through the transparent substrate 106. The transparent substrate 106 may be, for example, a glass substrate, quartz substrate, transparent polymer substrate, or combinations thereof.

As shown in FIG. 1A, in one embodiment, a light shielding layer 108 may be optionally formed on the lower surface of the transparent substrate 106. The light shielding layer 108 may include material that is suitable for blocking and/or absorbing light from external environment, such as a polymer material, a metal material, or combinations thereof. For example, the light shielding layer 108 may be (but is not limited to) a black photoresist layer which can be patterned through an exposure process and a development process.

After the light shielding layer 108 is patterned, the light shielding layer 108 may cover most portions of the lower surface of the transparent substrate 106 such that only a portion of the transparent substrate 106 directly under the optical device 102 is exposed. This is beneficial for light from the outside of the chip package to be blocked and/or absorbed and so that the operation of the optical device 102 is not affected.

For example, if the optical device 102 is an image sensor device, the light shielding layer 108 may block light coming from the surface 100a of the substrate 100 to prevent an image noise signal from occurring. Alternatively, if the optical device 102 is a light emitting device, the light shielding layer 108 may block light coming from the surface 100a of the substrate 100 to prevent a wavelength and/or an intensity of the light emitted from the chip package from being affected by the external light.

In one embodiment, the patterned light shielding layer 108 not only has an opening, exposing the portion of the transparent substrate 106 directly under the optical device 102, but also has an opening exposing a portion of the transparent substrate 106 near a predetermined scribe line SC. Thus, in a following dicing process, the patterned light shielding layer 108 will not peel due to the pulling of a dicing blade.

Figure 1B:
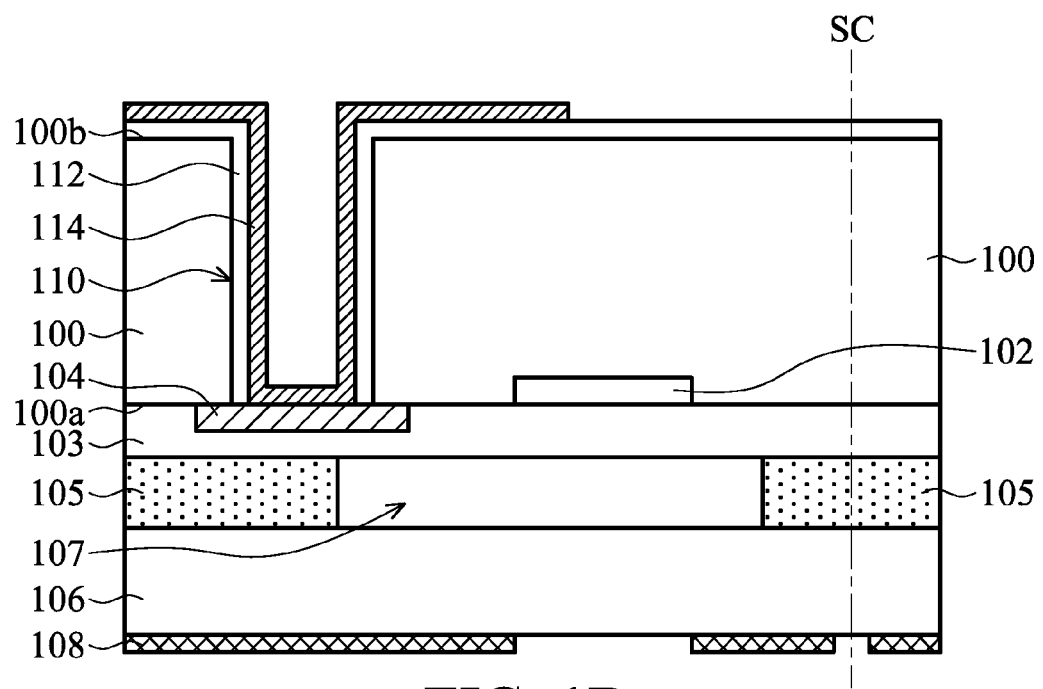

As shown in FIG. 1B, in one embodiment, a through-hole 110 may be optionally formed in the substrate 100. For example, a portion of the substrate 100 may be removed from the surface 100b of the substrate 100 to form the through-hole 110 extending towards the surface 100a. In one embodiment, a bottom of the through-hole 110 may expose a portion of the conducting pad 104. Further, a sidewall of the through-hole 110 may be a vertical sidewall or an inclined sidewall. In one embodiment, a size of an opening of the through-hole 110 is decreasing from the upper portion to the lower portion of the through-hole 110. In another embodiment, the size of the opening of the through-hole 110 is increasing from the upper portion to the lower portion of the through-hole 110. That is, in this case, the through-hole 110 has an "inverted angle" structure. In addition, in another embodiment, before the through-hole 110 is formed, a thinning process may be optionally performed to the substrate 100 to facilitate following processes. For example, the transparent substrate 106 may be used as a support, and a thinning process such as a mechanical grinding or a chemical mechanical polishing process is performed from the surface 100b of the substrate 100 to reduce the substrate 100 to a predetermined thickness.

Next, as shown in FIG. 1B, in one embodiment, an insulating layer 112 is formed on a sidewall of the through-hole 110 and the surface 100b of the substrate 100. Then, a conducting layer 114 is formed on the insulating layer 112 on the sidewall of the through-hole 110 and the insulating layer 112 on the surface 100b. In one embodiment, the conducting layer 114 is electrically connected to the conducting pad 104. The conducting layer 114 may electrically contact with the conducting pad 104 at the bottom of the through-hole and extend upwards to be on the surface 100b along the sidewall of the through-hole 110.

Figure 1C:
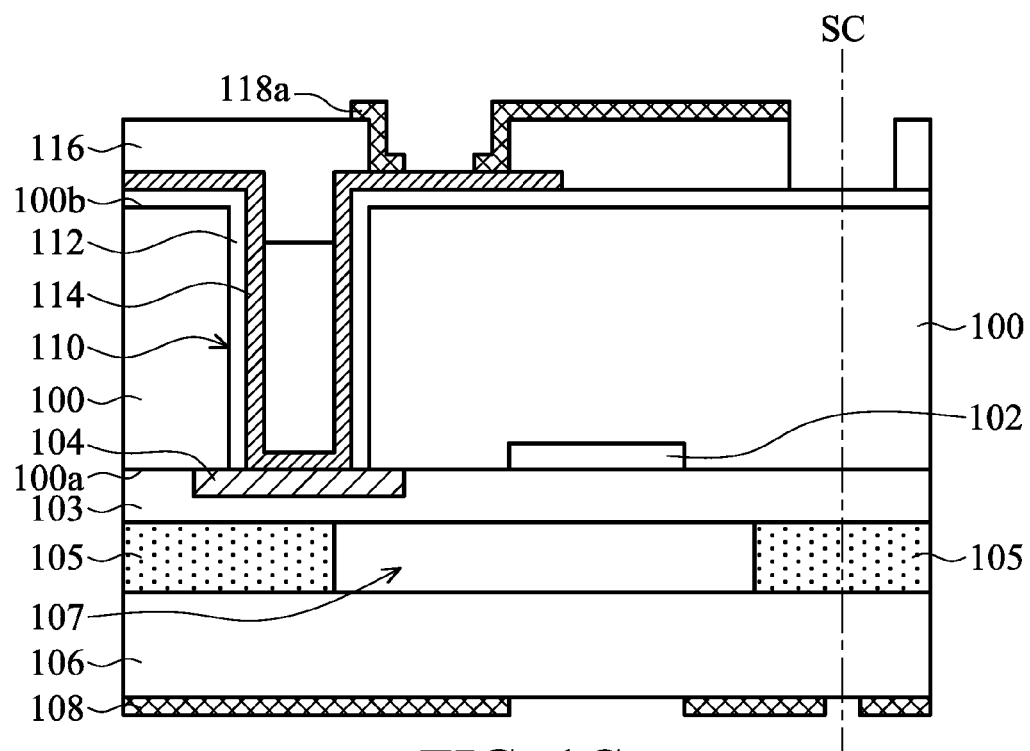

As shown in FIG. 1C, in one embodiment, a protection layer 116 may be formed on the surface 100b of the substrate 100, which may be, for example, a solder mask layer, a green dye, or the like thereof. After the protection layer 116 is formed, a portion of the protection layer 116 may be removed to form an opening exposing a portion of the conducting layer 114. In one embodiment, in order to facilitate the following dicing process, an edge of the protection layer 116 is separated from the predetermined scribe line SC by a predetermined distance.

Next, as shown in FIG. 1C, a light shielding layer 118a is formed on the surface 100b of the substrate 100. In one embodiment, the light shielding layer 118a is formed on the protection layer 116 and extends on a sidewall of the opening of the protection layer 116. The material of the light shielding layer 118a may be similar to that of the light shielding layer 108. Thus, the light shielding layer 118a may block and/or absorb light coming from the outside of the chip package, especially light coming from the surface 100b of the substrate 100, to facilitate the operation of the optical device 102.

Note that, in one embodiment, because the light shielding layer 118a further covers the sidewall of the opening of the protection layer 116, moisture may be prevented from entering inside of the package and affecting the reliability of the package. Further, the light shielding layer 118a covering the sidewall of the opening of the protection layer 116 may also prevent a conducting bump, which will be formed in the opening in a following process step, from "leaking" to ensure quality of the package. The light shielding layer 118a may also provide a smoother surface profile (compared with the protection layer 116 having a rougher surface profile) such that the conducting bump, which will be formed in the opening of the protection layer 116, is firmly formed. For example, an adhesion between an under bump metallurgy layer of the conducting bump and the light shielding layer 118a having the smoother surface profile may be better.

Figure 1D:
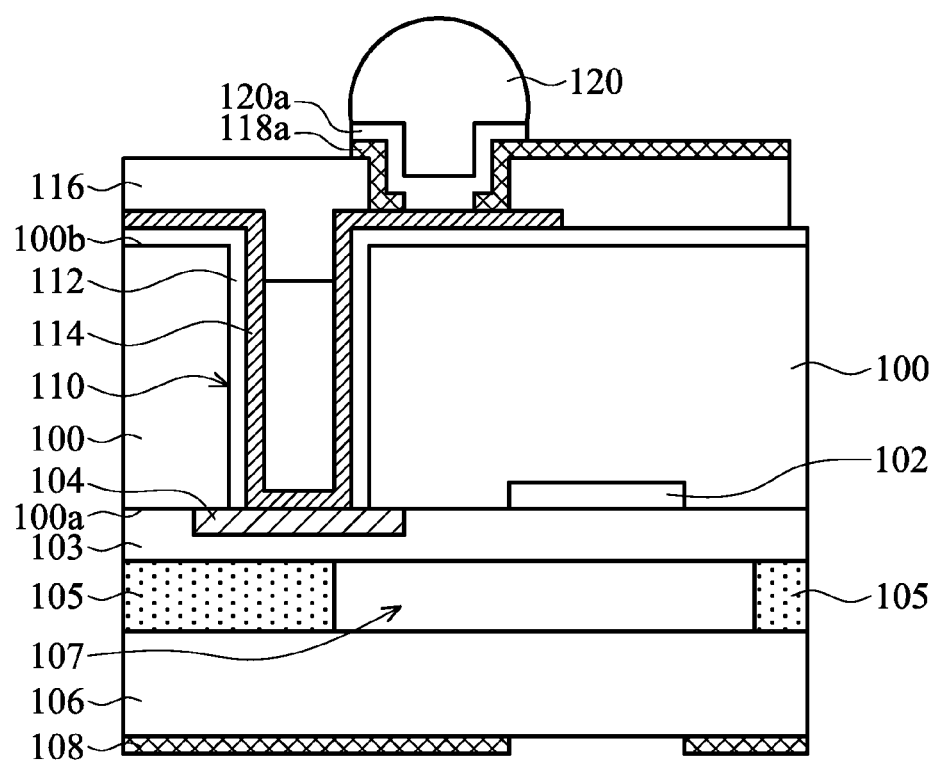

Next, as shown in FIG. 1D, a conducting bump 120 is formed in the opening of the protection layer 116. For example, an under bump metallurgy layer 120a is formed and the conducting bump 120 is then formed thereon. The conducting bump 120 is electrically connected to the optical device 102. For example, the conducting bump 120 may be electrically connected to the conducting pad 104 through the conducting layer 114 thereunder and further electrically connected to the optical device 102. Then, a dicing process may be performed along the predetermined scribe line SC to form a plurality of separate chip packages. In one embodiment, the edge of the protection layer 116 is separated from a sidewall of the substrate 100 by a predetermined distance.

Figure 2A:
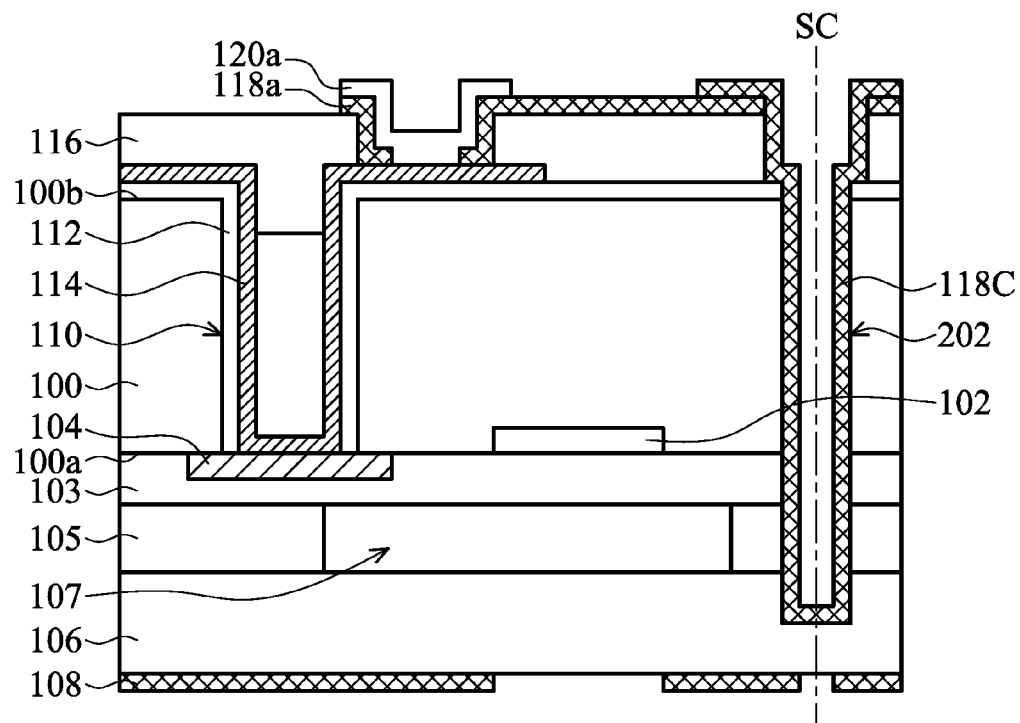
FIGS. 2A-2B are cross-sectional views showing the steps of forming a chip package in accordance with an embodiment of the present invention.
Figure 2B:
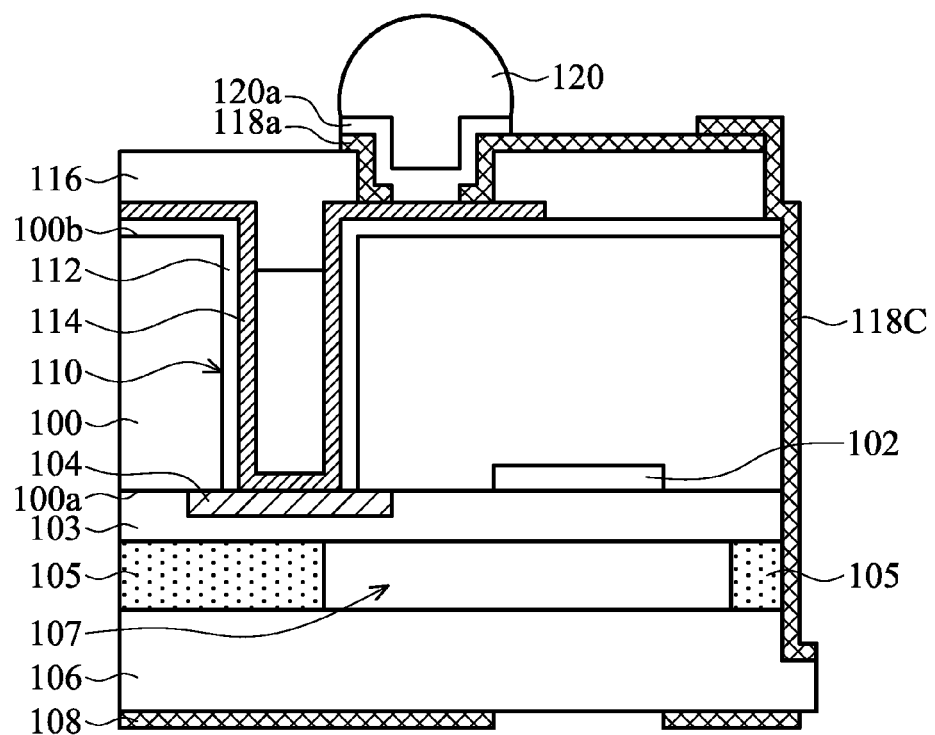

FIGS. 2A-2B are cross-sectional views showing the steps of forming a chip package according to another embodiment of the present invention, wherein same or similar reference numbers are used to designate same or similar elements.

FIG. 2A shows a structure similar to that shown in FIG. 1C. In one embodiment, a pre-dicing process may be performed along the predetermined scribe line SC to form a recess 202. For example, the recess 202 may extend from the protection layer 116 on the substrate 100 towards the surface 100a of the substrate 100. For example, the recess 202 may penetrate the spacer layer 105 and extend into the transparent substrate 106.

Next, as shown in FIG. 2A, a light shielding layer 118c is formed on a sidewall and a bottom of the recess 202. The material of the light shielding layer 118c may be similar to that of the light shielding layer 108 or 118a. In one embodiment, a thickness of the light shielding layer 118c is smaller than that of the light shielding layer 118a.

As shown in FIG. 2B, after the conducting bump 120 is formed, the transparent substrate 106 is completely cut through, along the predetermined scribe line SC to form a plurality of separate chip packages. As shown in FIG. 2B, in this embodiment, the chip package further includes a light shielding layer 118c which is extended onto the sidewall of the substrate 100. In one embodiment, the light shielding layer 118c further extended onto the sidewall of the transparent substrate 106. Because the light shielding layer 118c further covers the sidewall of the substrate 100, blocking and/or absorbing of light coming from the outside of the chip package is facilitated to improve the operation of the optical device 102. In addition, because the light shielding layer 118c covers regions that have been cut by a dicing blade, defects or cracks generated during the dicing process may be covered. Due to repair of the light shielding layer 118c, the quality and the reliability of the chip package may be improved.

Figure 7A:
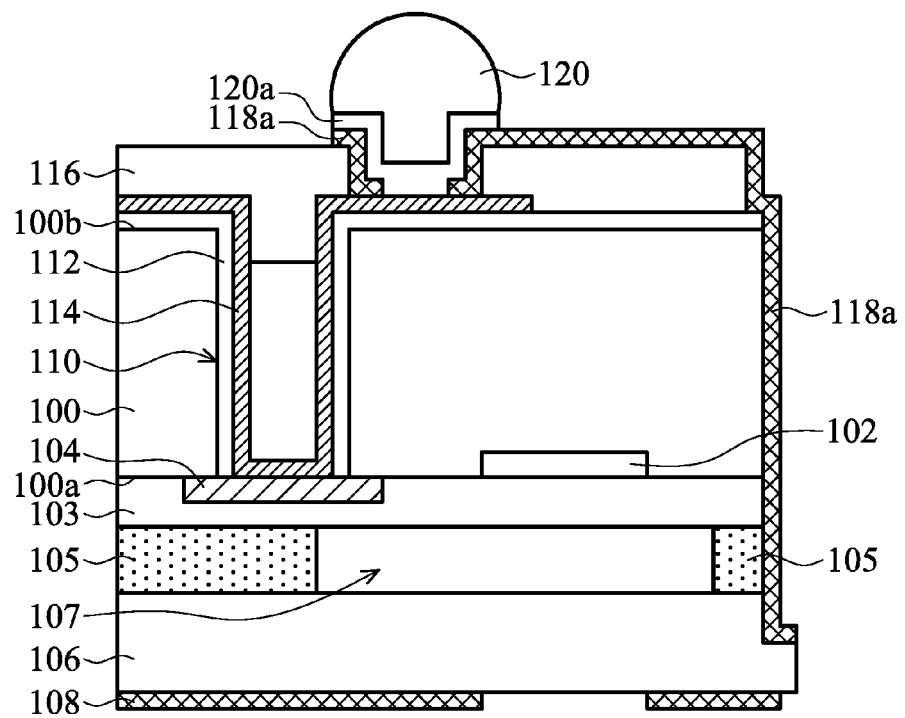
FIGS. 7A-7C are cross-sectional views showing chip packages in accordance with embodiments of the present invention.

Note that although the light shielding layer 118c is additionally formed to cover the sidewall of the substrate 100 in the embodiment shown in FIG. 2B, embodiments of the invention are not limited thereto. In another embodiment, the light shielding layer 118a and the following material layer (including the under bump metallurgy layer 120a) may be formed after the recess 202 is formed. In this case, the light shielding layer 118a is not only formed on the protection layer 116, but is also further extended onto the sidewall of the substrate 100 or even further extended onto the sidewall of the transparent substrate 106, such as the structure shown in FIG. 7A. In this case, the formation of the light shielding layer 118c may be omitted according to requirements.

Figure 3A:
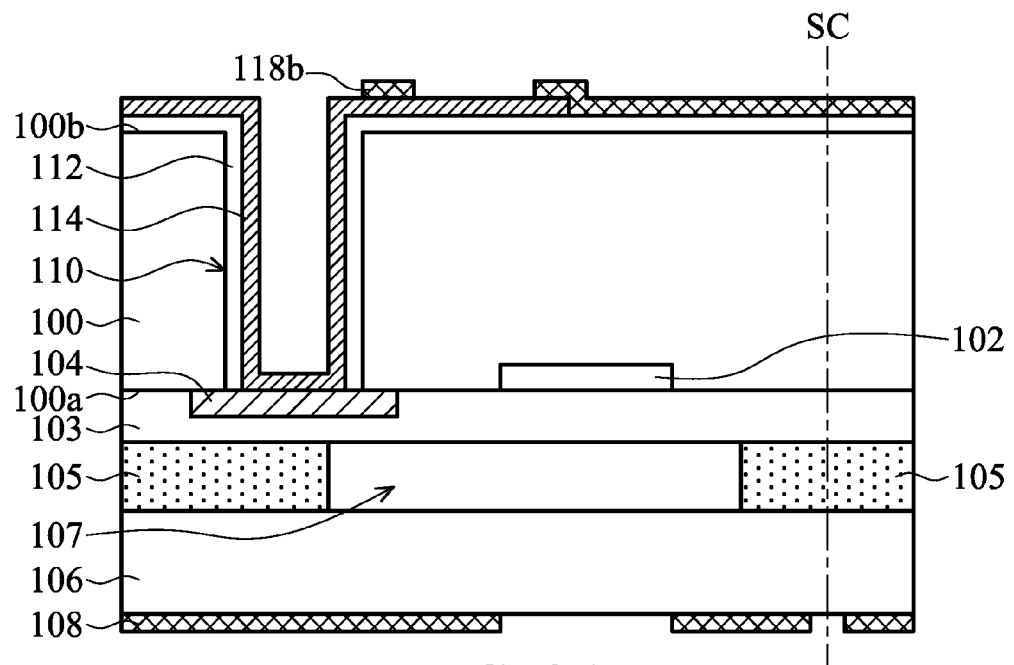
FIGS. 3A-3B are cross-sectional views showing the steps of forming a chip package in accordance with an embodiment of the present invention.
Figure 3B:
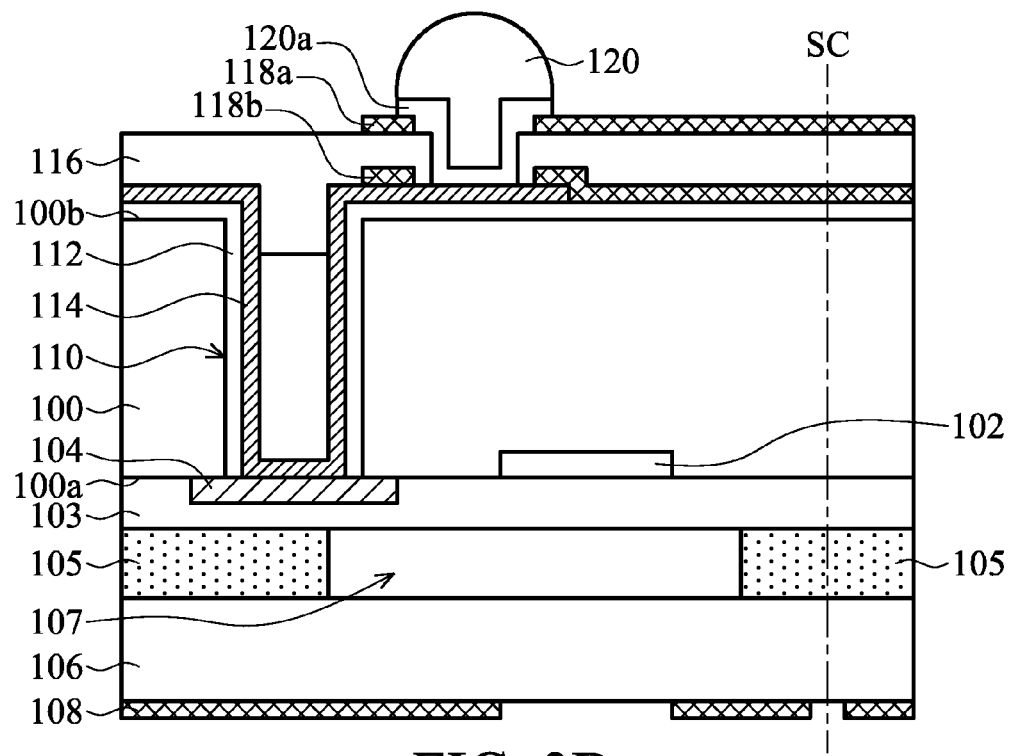

FIGS. 3A-3B are cross-sectional views showing the steps of forming a chip package according to an embodiment of the present invention, wherein same or similar reference numbers are used to designate same or similar elements.

As shown in FIG. 3A, a structure similar to that shown in FIG. 1B is provided. After the conducting layer 114 is formed and before the protection layer is formed, a light shielding layer 118b is formed on the surface 100b of the substrate 100. The material of the light shielding layer 118b may be similar to that of the light shielding layer 108. In one embodiment, the light shielding layer 118b directly contacts with the conducting layer 114.

Next, as shown in FIG. 3B, the protection layer 116, the light shielding layer 118a, the under bump metallurgy layer 120a, and the conducting bump 120 may be sequentially formed on the surface 100b of the substrate 100 by methods similar to those of the above-mentioned embodiments. In this embodiment, a plurality of light shielding layers are formed on the surface 100b of the substrate 100. Light coming from the outside of the chip package may be blocked and/or absorbed more effectively to facilitate the operation of the optical device 102. In one embodiment, a thickness of the light shielding layer 118b is smaller than the thickness of the light shielding layer 118a. Note that although only two light shielding layers which do not contact with each other are formed on the surface 100b of the substrate 100, embodiments of the invention are not limited thereto. In another embodiment, more light shielding layers which contact with each other or do not contact with each other may be formed on the surface 100b of the substrate 100.

Figure 4:
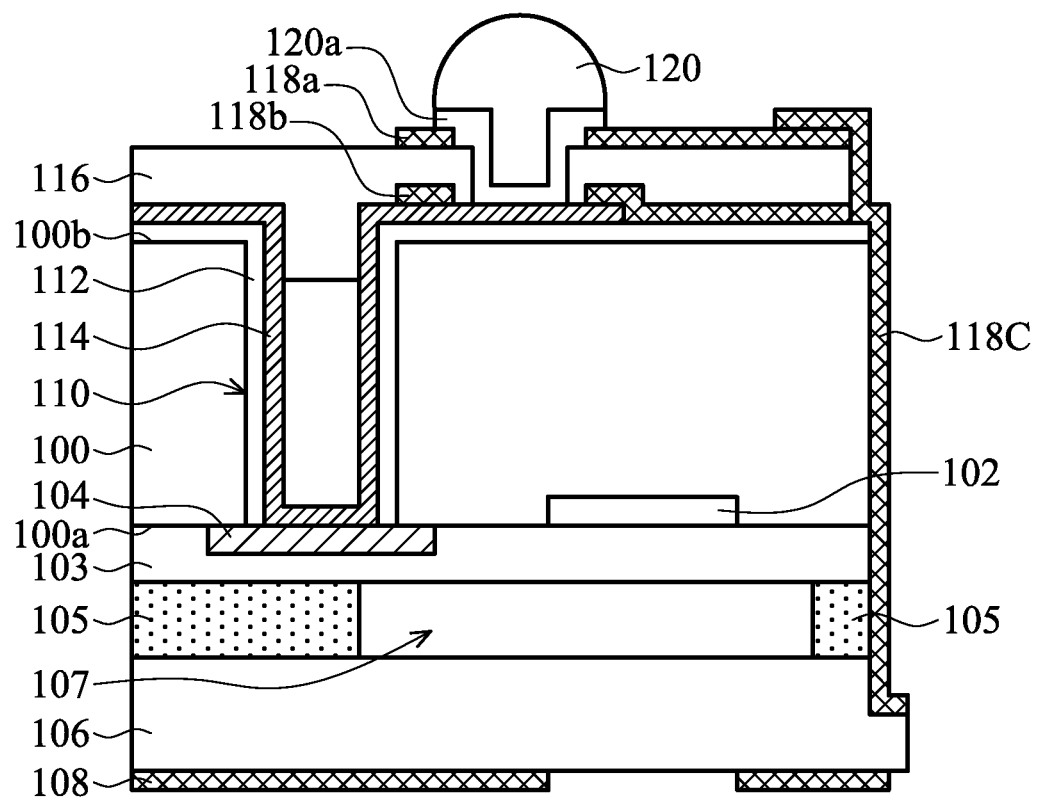
FIG. 4 is a cross-sectional view showing a chip package in accordance with an embodiment of the present invention.

FIG. 4 is a cross-sectional view showing a chip package according to an embodiment of the present invention, wherein same or similar reference numbers are used to designate same or similar elements.

Figure 7B:
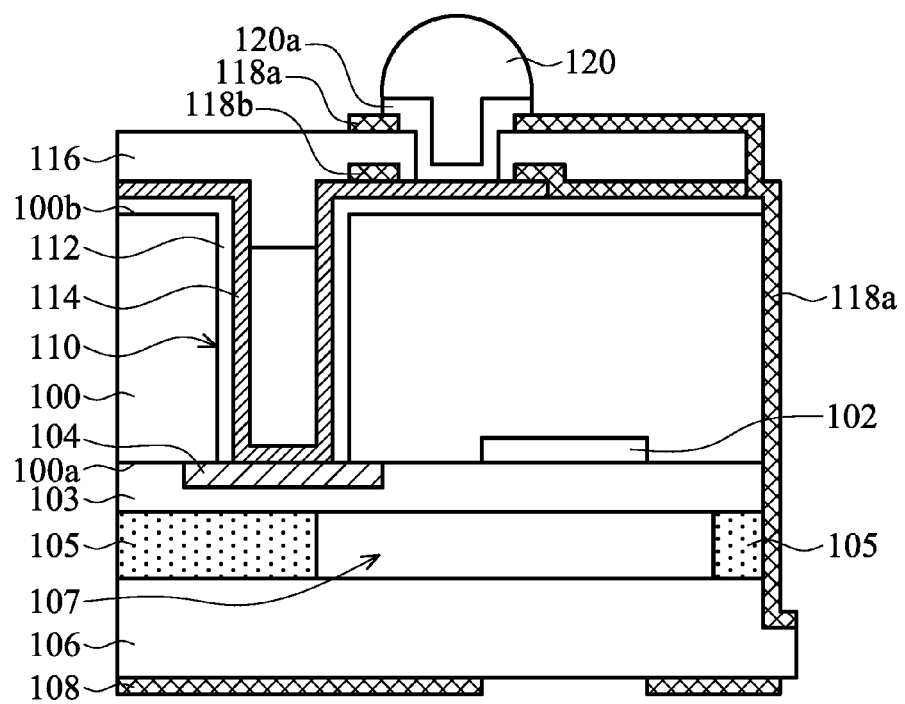

The chip package of the embodiment shown in FIG. 4 is similar to the embodiment shown in FIG. 3B. The chip package of the embodiment shown in FIG. 4 further includes a light shielding layer 118c extending onto the sidewall of the substrate 100. A thickness of the light shielding layer 118c is typically smaller than the thickness of the light shielding layer 118a. The formation method for the light shielding layer 118c may be similar to that for the light shielding layer 118c in the embodiment shown in FIG. 2. Similarly, in another embodiment, the light shielding layer 118a itself may be extended onto the sidewall of the substrate 100, such as the structure shown in FIG. 7B. In this case, the formation of the light shielding layer 118c may be omitted.

Figure 5A:
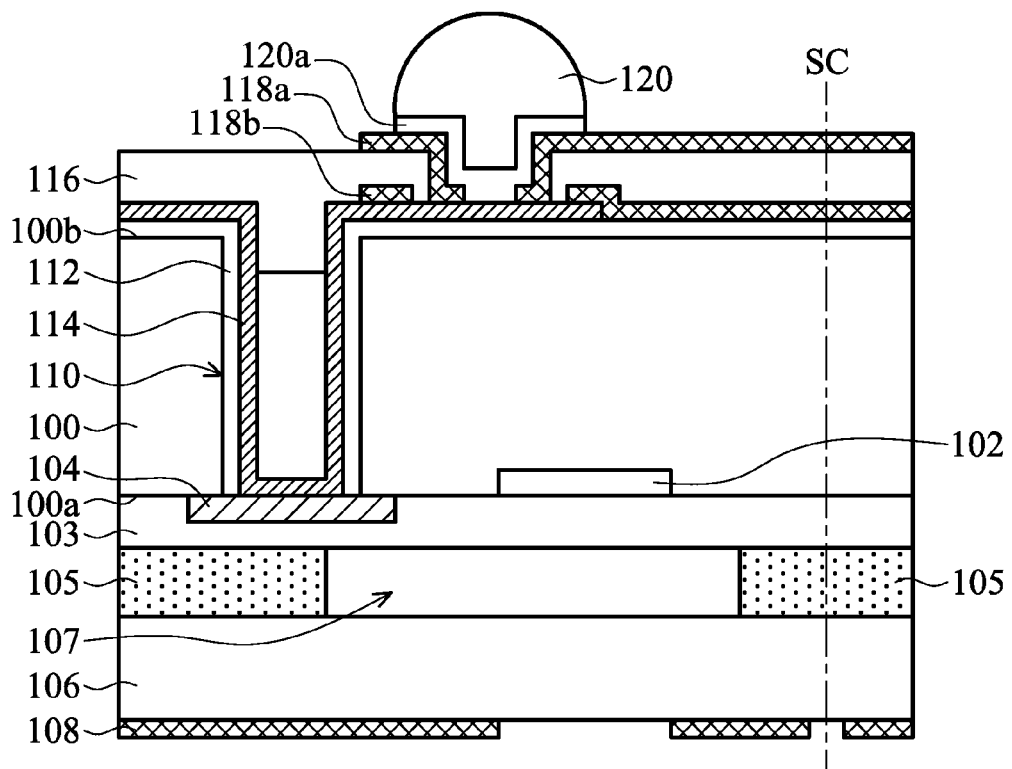
FIGS. 5A and 5B are cross-sectional views respectively showing chip packages in accordance with embodiments of the present invention.
Figure 5B:
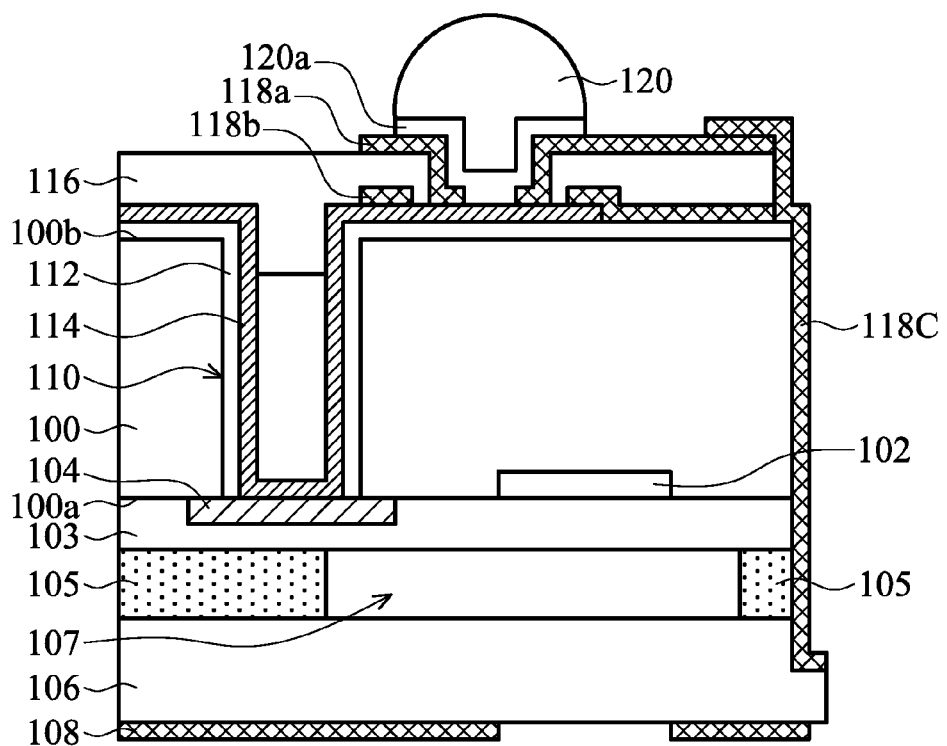

FIGS. 5A and 5B are cross-sectional views respectively showing chip packages according to embodiments of the present invention, wherein same or similar reference numbers are used to designate same or similar elements.

The chip package of the embodiment shown in FIG. 5A is similar to the embodiment shown in FIG. 3B. The main difference is that the light shielding layer 118a of the embodiment shown in FIG. 5A is further extended onto the sidewall of the opening of the protection layer 116. Thus, the shielding layer 118a may further prevent moisture from entering into the chip package and leakage of the solder material is prevented from occurring. The light shielding layer 118a may provide a smoother surface profile such that the conducting bump 120, which is subsequently formed, is firmly formed.

Figure 7C:
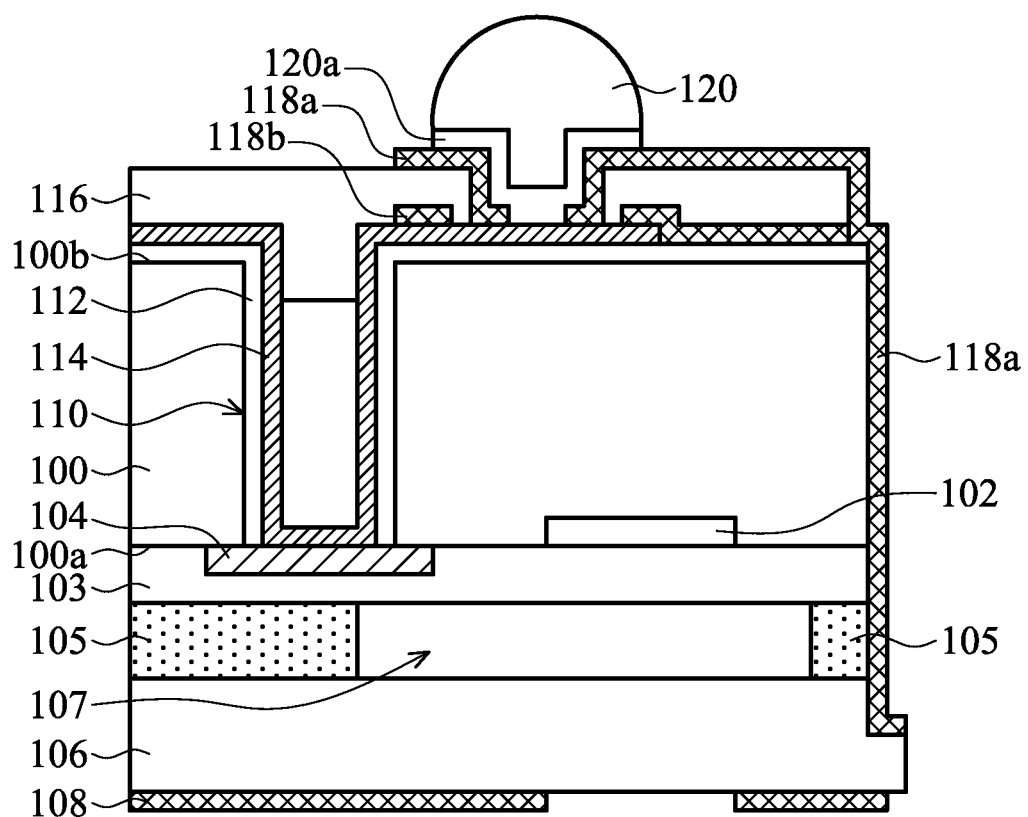

The chip package of the embodiment shown in FIG. 5B is similar to the embodiment shown in FIG. 5A. The main difference is that the chip package of the embodiment shown in FIG. 5B further includes a light shielding layer 118c which is extended onto the sidewall of the substrate 100. In one embodiment, the light shielding layer 118c is further extended onto the sidewall of the transparent substrate 106. Because the light shielding layer 118c further covers the sidewall of the substrate 100, blocking and/or absorbing of light coming from the outside of the chip package is facilitated to improve the operation of the optical device 102. In addition, because the light shielding layer 118c covers regions that have been cut by a dicing blade, defects or cracks generated during the dicing process may be covered. Due to the repair of the light shielding layer 118c, the quality and the reliability of the chip package may be improved. Similarly, note that the light shielding layer 118a itself may be extended onto the sidewall of the substrate 100, such as the structure shown in FIG. 7C. In this case, the formation of the light shielding layer 118C may be omitted.

Figure 6A:
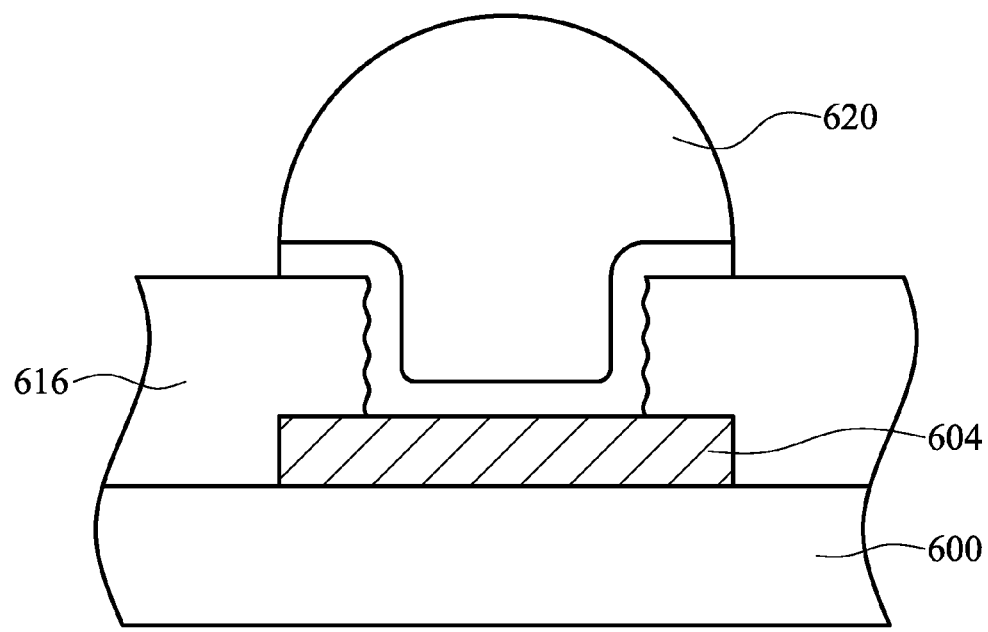
FIG. 6A is a cross-sectional view showing a bump structure known by the inventor.

FIG. 6A is a cross-sectional view showing a bump structure known by the inventor. As shown in FIG. 6A, a conducting pad 604 and a protection layer 616 are formed on a substrate 600. Usually, the protection layer 616 has an uneven surface such that a conducting bump 620 formed therein is relatively weak. In addition, the package may easily suffer problems of moisture and/or leakage of solder material.

Figure 6B:
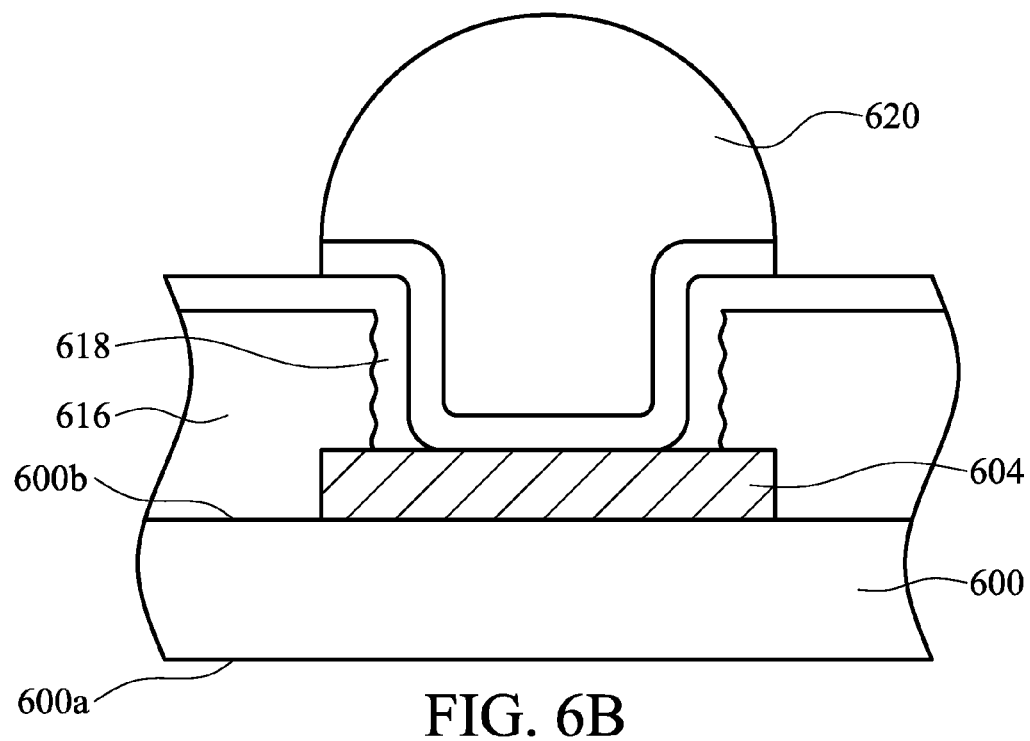
FIG. 6B is a cross-sectional view showing a chip package in accordance with an embodiment of the present invention.

FIG. 6B is a cross-sectional view showing a chip package according to an embodiment of the present invention. The chip package includes a substrate 600 having a surface 600a and a surface 600b, a protection layer 616 having at least an opening, at least a conducting bump 620 formed in the opening of the protection layer 616, and an insulating smooth layer 618 formed between the conducting bump 620 and the sidewall of the opening. The insulating smooth layer 618 is an insulating material layer and has a smooth surface profile. The insulating smooth layer 618 may make the conducting bump, which will be subsequently formed in the opening of the protection layer 616 firmly formed. For example, adhesion between the under bump metallurgy layer of the conducting bump and the insulating smooth layer 618 with a smooth surface may be better.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
    a substrate having a first surface and a second surface;
    an optical device between the first surface and the second surface of the substrate;
    a protection layer formed on the second surface of the substrate, wherein the protection layer has at least an opening;
    at least a conducting bump formed in the opening of the protection layer and electrically connected to the optical device; and
    a light shielding layer formed on the protection layer and extending onto a sidewall of the opening of the protection layer, wherein the light shielding layer comprises a polymer material.

2. The chip package as claimed in claim 1, further comprising a conducting layer formed on the second surface of the substrate, wherein the conducting layer electrically contacts with the conducting bump and electrically connects to the optical device.

3. The chip package as claimed in claim 1, further comprising a second light shielding layer formed on the second surface of the substrate.

4. The chip package as claimed in claim 1, further comprising:
    a transparent substrate disposed on the first surface of the substrate; and
    a third light shielding layer formed on a surface of the transparent substrate.

5. The chip package as claimed in claim 1, wherein an edge of the protection layer is not coplanar with a sidewall of the substrate.

6. The chip package as claimed in claim 2, wherein the light shielding layer directly contacts with the conducting layer.

7. The chip package as claimed in claim 3, wherein the second light shielding layer is located between the substrate and the protection layer.

8. The chip package as claimed in claim 3, wherein the second light shielding layer is further extended onto a sidewall of the substrate.

9. The chip package as claimed in claim 3, wherein the second light shielding layer comprises a polymer material.

10. The chip package as claimed in claim 7, wherein a thickness of the second light shielding layer is smaller than a thickness of the light shielding layer.

11. The chip package as claimed in claim 8, wherein a thickness of the second light shielding layer is smaller than a thickness of the light shielding layer.

12. The chip package as claimed in claim 8, further comprising a transparent substrate disposed on the first surface of the substrate, wherein the second light shielding layer is further extended onto a sidewall of the transparent substrate.

13. A chip package, comprising:
    a substrate having a first surface and a second surface;
    an optical device between the first surface and the second surface of the substrate;
    a protection layer formed on the second surface of the substrate, wherein the protection layer has at least an opening;
    at least a conducting bump formed in the opening of the protection layer and electrically connected to the optical device; and
    a light shielding layer formed on the protection layer and extending onto a sidewall of the opening of the protection layer, wherein the light shielding layer is further extended onto a sidewall of the substrate.

14. The chip package as claimed in claim 13, further comprising a transparent substrate disposed on the first surface of the substrate, wherein the light shielding layer is further extended onto a sidewall of the transparent substrate.

15. A chip package, comprising:
a substrate having a first surface and a second surface;
an optical device between the first surface and the second surface of the substrate;
a protection layer formed on the second surface of the substrate, wherein the protection layer has at least an opening;
at least a conducting bump formed in the opening of the protection layer and electrically connected to the optical device;
a light shielding layer formed on the second surface of the substrate, wherein the light shielding layer comprises a polymer material; and
at least a second light shielding layer formed on the second surface of the substrate.

16. The chip package as claimed in claim 15, wherein the light shielding layer is formed on a surface of the protection layer.

17. The chip package as claimed in claim 15, wherein the second light shielding layer is located between the protection layer and the substrate.

18. The chip package as claimed in claim 15, wherein a thickness of the second light shielding layer is smaller than a thickness of the light shielding layer.

19. The chip package as claimed in claim 15, wherein the light shielding layer is further extended onto a sidewall of the substrate.

20. The chip package as claimed in claim 15, further comprising a third light shielding layer formed on a sidewall of the substrate.

21. The chip package as claimed in claim 15, further comprising:
a transparent substrate disposed on the first surface of the substrate; and
a fourth light shielding layer formed on a surface of the transparent substrate.

22. The chip package as claimed in claim 15, wherein an edge of the protection layer is not coplanar with a sidewall of the substrate.

23. The chip package as claimed in claim 16, wherein the light shielding layer is further extended onto a sidewall of the opening of the protection layer.

24. The chip package as claimed in claim 15, wherein the second light shielding layer comprises a polymer material.

25. The chip package as claimed in claim 19, further comprising a transparent substrate disposed on the first surface of the substrate, wherein the light shielding layer is further extended onto a sidewall of the transparent substrate.

26. The chip package as claimed in claim 20, wherein a thickness of the third light shielding layer is smaller than a thickness of the light shielding layer.

27. The chip package as claimed in claim 20, further comprising a transparent substrate disposed on the first surface of the substrate, wherein the third light shielding layer is further extended onto a sidewall of the transparent substrate.

28. A chip package, comprising:
a substrate having a first surface and a second surface;
an optical device between the first surface and the second surface of the substrate;
a protection layer formed on the second surface of the substrate, wherein the protection layer has at least an opening;
at least a conducting bump formed in the opening of the protection layer and electrically connected to the optical device;
a light shielding layer formed on the second surface of the substrate; and
at least a second light shielding layer formed on the second surface of the substrate, wherein the light shielding layer does not directly contact with the second light shielding layer.

* * * * *